(12) United States Patent
Madocks et al.

(10) Patent No.: US 8,535,490 B2
(45) Date of Patent: Sep. 17, 2013

(54) ROTATABLE MAGNETRON SPUTTERING WITH AXIALLY MOVABLE TARGET ELECTRODE TUBE

(75) Inventors: John Madocks, Tucson, AZ (US); Patrick Lawrence Morse, Tucson, AZ (US)

(73) Assignee: General Plasma, Inc., Tucson, AZ (US)

( * ) Notice: Subject to any disclaimer, the term of this patent is extended or adjusted under 35 U.S.C. 154(b) by 771 days.

(21) Appl. No.: 12/602,298

(22) PCT Filed: Jun. 6, 2008

(86) PCT No.: PCT/US2008/066145
§ 371 (c)(1),
(2), (4) Date: Jan. 18, 2010

(87) PCT Pub. No.: WO2008/154397
PCT Pub. Date: Dec. 18, 2008

(65) Prior Publication Data
US 2010/0155226 A1   Jun. 24, 2010

Related U.S. Application Data

(60) Provisional application No. 60/942,986, filed on Jun. 8, 2007.

(51) Int. Cl.
*C23C 14/00* (2006.01)
(52) U.S. Cl.
USPC ............ 204/192.12; 204/298.21; 204/298.22
(58) Field of Classification Search
USPC .......................... 204/192.12, 298.21, 298.22
See application file for complete search history.

(56) References Cited

U.S. PATENT DOCUMENTS

| | | | | |
|---|---|---|---|---|
| 4,904,362 | A * | 2/1990 | Gaertner et al. | 204/192.12 |
| 5,200,049 | A * | 4/1993 | Stevenson et al. | 204/298.22 |
| 6,488,824 | B1 | 12/2002 | Hollars et al. | |
| 7,993,496 | B2 * | 8/2011 | Hartig et al. | 204/192.12 |
| 2006/0000705 | A1 | 1/2006 | Hartig et al. | |
| 2011/0192715 | A1 | 8/2011 | Weichart | |

FOREIGN PATENT DOCUMENTS

| | | | |
|---|---|---|---|
| JP | 59013068 A * | 1/1984 | |
| JP | 01112199 | 5/1989 | |
| JP | 03262308 | 10/1991 | |

* cited by examiner

*Primary Examiner* — John Brayton
(74) *Attorney, Agent, or Firm* — Blue Filament Law PLLC; Avery N. Goldstein

(57) ABSTRACT

A new and useful rotatable sputter magnetron assembly is provided, that addresses the issue of uneven wear of the target electrode tube. According to the principles of the present invention, a rotatable sputter magnetron assembly for use in magnetron sputtering target material onto a substrate comprises a. a longitudinally extending tubular shaped target electrode tube having a longitudinal central axis, b. the target electrode tube extending about a magnet bar that is configured to generate a plasma confining magnetic field adjacent the target electrode tube, c. the magnet bar being held substantially stationary within the target electrode tube, and d. the target electrode tube supported for rotation about its longitudinal central axis and for axial movement along its longitudinal central axis, so that wear of the target electrode tube can be controlled by moving the target electrode tube axially during magnetron sputtering of the target material.

19 Claims, 2 Drawing Sheets

ROTATABLE MAGNETRON SPUTTERING WITH AXIALLY MOVABLE TARGET ELECTRODE TUBE

RELATED APPLICATION/CLAIM OF PRIORITY

This application is related to and claims priority from provisional application Ser. No. 60/942,986, filed Jun. 8, 2007, which provisional application is incorporated by reference herein.

BACKGROUND

The present invention relates to a new and useful sputter magnetron assembly for use in rotatable magnetron sputtering target material onto a substrate.

In rotatable magnetron plasma sputtering, it is known to provide a stationary magnet and a target cathode in the form of a cylindrical tube that surrounds the stationary magnet bar. However, as explained in US published application US 2006/0000705 A1, one problem with then existing target cathode structures is that the targets (generally target electrode tubes) don't wear uniformly along their lengths. There is increased erosion near the ends of the target electrode tubes, and less erosion in the center. The solution to that problem disclosed by the '705 published application is to oscillate the magnet bar axially within the target electrode tube. A framework supports the magnet bar against rotation within the target electrode tube, and a mechanism is provided for oscillating the magnet bar axially within the target electrode tube.

SUMMARY OF THE INVENTION

The present invention provides a new and useful sputter magnetron assembly that addresses the issue of uneven wear of the target electrode tube in a different way and with different operating principles than the approach of US published application US 2006/0000705 A1. Moreover, the principles of the present invention provide for improved sputter deposition over the '705 published application.

According to the principles of the present invention, a sputter magnetron assembly for use in magnetron sputtering target material onto a substrate comprises
  a. a longitudinally extending target electrode tube having a longitudinal central axis,
  b. the target electrode tube extending about a magnet bar that is configured to generate a plasma confining magnetic field adjacent the target electrode tube,
  c. the magnet bar being held substantially stationary within the target electrode tube, and
  d. the target electrode tube supported for rotation about its longitudinal central axis and for axial movement along its longitudinal central axis, so that wear of the target electrode tube can be controlled by moving the target electrode tube axially during magnetron sputtering of the target material.

In a preferred embodiment, the target electrode tube is coupled with a feedthrough that extends about the longitudinal central axis and is supported for rotation about the longitudinal central axis, in a manner such that the target electrode tube rotates with the feedthrough about the longitudinal central axis, and wherein the target electrode tube extends through the feedthrough and can move axially relative to the feedthrough as the target electrode tube and the feedthrough are rotated about the longitudinal central axis.

In addition, the coupling between the target electrode tube and the feedthrough is located at least partially in a vacuum chamber area that needs to be sealed from the atmosphere while enabling the target electrode tube to be rotated with the feedthrough and moved axially relative to the feedthrough. In accordance with the present invention, the coupling between the feedthrough and the target electrode tube is configured to seal the vacuum chamber area from the atmosphere.

Other features of the present invention will become further apparent from the following detailed description and the accompanying drawings.

DETAILED DESCRIPTION

As discussed above, the present invention relates to a new and useful sputter magnetron assembly for use in rotatable magnetron sputtering. The following detailed description relates to a preferred sputter magnetron assembly according to the principles of the present invention, and from that description the manner in which the principles of the invention can be implemented in various sputter magnetron assemblies will be clear to those in the art.

Figure 1:
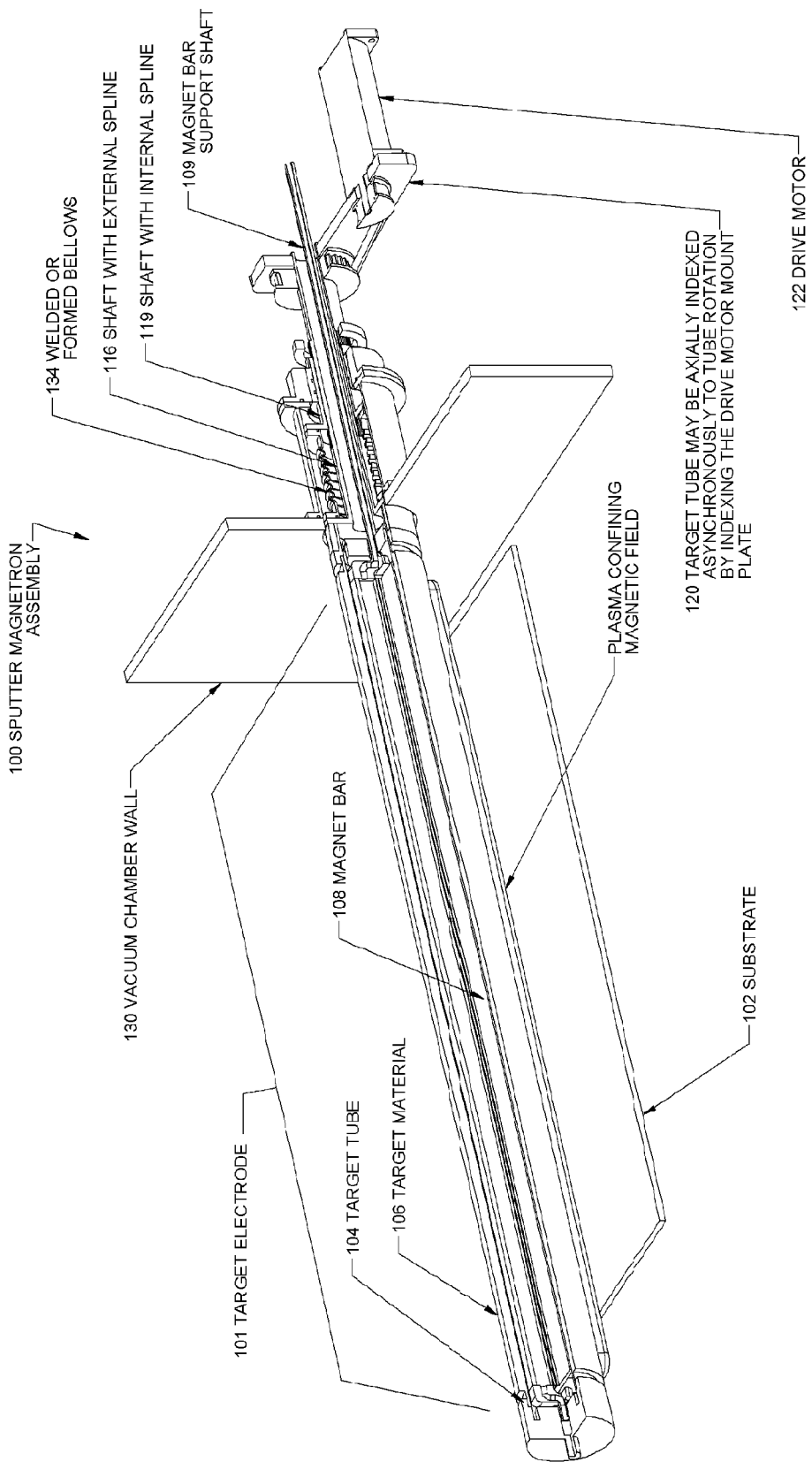
FIG. 1 is a perspective view of a sputter magnetron assembly according to the present invention, with portions broken away.

FIG. 1 schematically illustrates a sputter magnetron assembly 100 for use in magnetron sputtering target material onto a substrate 102. As is typical in a sputter magnetron assembly, a target electrode assembly 101 may be a cathode electrode that is preferably configured as a cylindrical geometry. The target electrode assembly 101 may comprise a target electrode tube 104 with target material 106 on its exterior. A magnet bar 108 is provided within the cylindrical target electrode tube 104, and produces a magnetic field that confines a magnetron plasma adjacent the target material 106. The magnetron plasma may be produced from an inert gas (e.g. argon) or from other known plasma producing gas. The magnetron plasma causes sputtering of target material 106 onto the substrate 102.

The magnet bar 108 is supported in target electrode tube 104 by magnet bar support 112 and is held stationary within the target electrode tube 104 (e.g. by a magnet bar support shaft 109), and a coolant fluid (e.g. water) is circulated through the tube to keep target electrode tube 104 and target material 106 relatively cool. The foregoing general principles of a rotatable sputter magnetron assembly are known to those in the art and should not require further explanation.

In the sputter magnetron assembly 100 of the present invention, the target electrode tube 104 extends longitudinally and has a longitudinal central axis 114. Magnet bar 108 is held stationary within the target electrode tube 104 and generates the plasma confining magnetic field adjacent target material 106.

In accordance with the principles of the present invention, the target electrode tube 104 is supported for rotation about its longitudinal central axis 114 and for axial movement along its longitudinal central axis 114, so that wear of the target material 106 can be controlled by moving the target electrode tube 104 both rotationally and axially (i.e. in the direction of its longitudinal central axis 114 during magnetron sputtering of the target material. Moreover, the target electrode tube 104 is coupled with the feedthrough 118 in the manner described below.

Specifically, the target electrode tube 104 is coupled with a target tube support shaft 116. The target tube support shaft 116 is coaxial with the longitudinal central axis 114, and extends axially through a rotatably supported feedthrough 118. The target tube support shaft 116 is coupled with the feedthrough 118 in a manner such that the support shaft 116 can be rotated about the longitudinal axis 114 (e.g. by a motor 122 that drives a timing pulley 124 by means of a timing belt 126). In one configuration, a motor mount plate 120 could be joined to the target tube support shaft 116 through a bearing connection capable of transmitting thrust loads, and the axial movement of the target tube support shaft 116 (and in turn the target electrode tube 104) could be achieved by moving the motor mounting plate 120 in the direction of the longitudinal central axis 114. In another configuration, the motor mounting plate 120 could remain stationary while the target tube support shaft 116 is independently moved in the direction of the longitudinal central axis 114. Those skilled in the art will see that there are multiple ways to achieve this motion. When the support shaft 116 is rotated, it rotates the feedthrough 118, and rotates the target electrode tube 104 about the longitudinal central axis 114. In addition, the target tube support shaft 116 can move axially through the feedthrough 118, so that the target electrode tube 104 can be moved axially relative to the stationary magnet 108. In the illustrated example, the rotatable feedthrough 118 is fixed to a member 119 that has internal splines that engage external splines on the target tube support shaft 116, so that the target tube support shaft 116 and the target electrode tube 104 can be rotated together about the longitudinal central axis 114. In addition, the engagement between the internal splines on the rotatable feedthrough 118 and the external splines on the target tube support shaft 116 enables the target tube support shaft 116 and the target electrode tube 104 to be moved axially relative to the magnet bar 108 (e.g. the motor mount plate 120 can be axially indexed asynchronously to rotation of the target tube 104).

Figure 2:
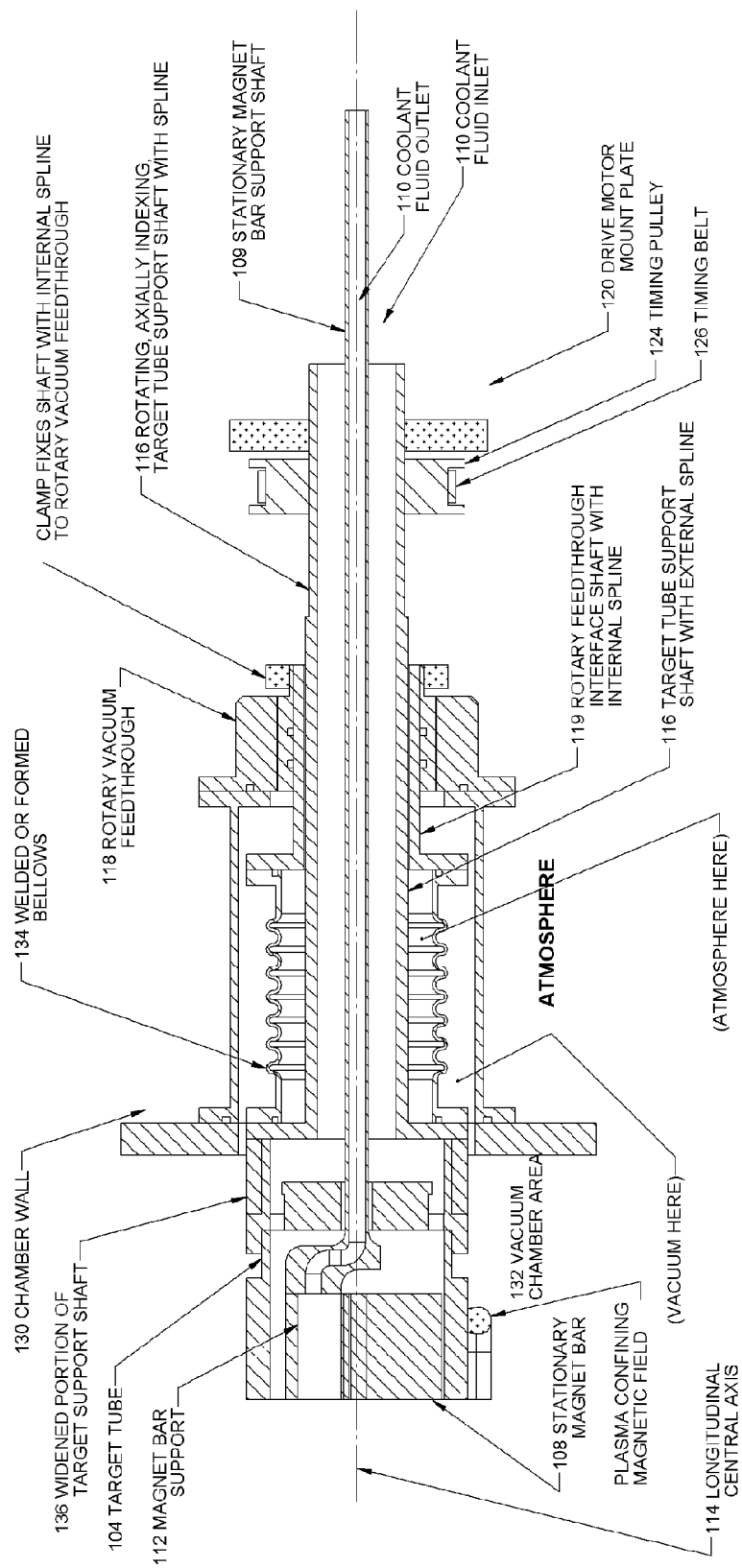
FIG. 2 is a fragmentary cross sectional view of the coupling portion of the sputter magnetron assembly, according to the principles of the present invention.

As described above, the target electrode assembly 101 is located in a vacuum chamber (in the figures, a wall 130 is illustrated that forms part of the vacuum chamber, and the vacuum and atmosphere sides of the vacuum chamber are shown in FIG. 2). As shown in FIG. 2, the target tube support shaft 116 extends through the wall 130 and into the vacuum chamber, where the support shaft is coupled to the target electrode tube 104. As further shown in FIG. 2, the target support shaft is coupled with the rotary feedthrough 118 in a vacuum chamber area 132 that is sealed, and is in communication with the vacuum chamber. In accordance with the present invention, the coupling between the target support shaft 116 and the rotary feedthrough is designed to provide a seal between the vacuum chamber area 132 and the atmosphere. Specifically, an expansible and contractible bellows 134 forms a seal at one end to a widened portion 136 of the target support shaft 116 and at the other end to the internally splined member 119 that is fixed to the rotary feedthrough 118. Thus, the bellows can expand and contract as the support shaft is axially moved relative to the rotary feedthrough 118, but as the bellows expands and contracts, it maintains a seal between the atmosphere and the vacuum in the vacuum chamber area that is outside the bellows. Thus, the coupling between the feedthrough 118 and the target electrode tube 104 is configured to seal the vacuum chamber area from the atmosphere.

Accordingly, the foregoing disclosure provides a new and useful rotatable sputter magnetron assembly that enables a target electrode tube to both rotate about and move axially relative to a stationary magnet, to enable wear of the target electrode tube to be made more even. Axially moving the target electrode tube while holding the magnet bar stationary holds the sputter plasma stationary over the substrate. This has several advantages over the technique of the published '705 application described above: 1) By holding the plasma stationary over the substrate, uniformity of deposition is improved. When the magnet bar is moved as in the published '705 application, this causes the sputter deposition to move and can detrimentally affect uniformity. 2) Because the plasma does not move, the cathode target can be made shorter relative to the substrate. When the magnet bar is moved as in the published '705 application, the target electrode tube must be made sufficiently long such that any uniformity variances due to the moving magnet bar are kept away from the substrate. 3) By enabling a shorter target electrode tube, smaller, more economical vacuum chambers can be used and target electrode tubes are made less expensively.

With the foregoing disclosure in mind, the manner in which the principles of the present invention can be used to form various types of sputter magetron assemblies will be apparent to those in the art.

The invention claimed is:

1. A rotatable sputter magnetron assembly for use in magnetron sputtering target material onto a substrate, comprising
   a. a longitudinally extending target electrode tube having a longitudinal central axis,
   b. the target electrode tube extending about a magnet bar that is configured to generate a plasma confining magnetic field adjacent the target electrode tube,
   c. the magnet bar being held substantially stationary within the target electrode tube, and
   d. the target electrode tube supported for rotation about its longitudinal central axis and for axial movement along its longitudinal central axis, allowing the target electrode tube to both rotate about and move axially relative to the stationary magnet, so that wear of the target electrode tube can be controlled by moving the target electrode tube linearly during magnetron sputtering of the target material.

2. A sputter magnetron assembly as defined in claim 1, wherein the target electrode tube is coupled with a feedthrough that extends about the longitudinal central axis and is supported for rotation about the longitudinal central axis, in a manner such that the target electrode tube rotates with the feedthrough about the longitudinal central axis and a coupling between the target electrode tube and the feedthrough includes a support member that is (a) coupled with the target electrode, (b) extends through the feedthrough and (c) can move linearly relative to the feedthrough, as the target electrode tube and the feedthrough are rotated about the longitudinal central axis.

3. A sputter magnetron assembly as defined in claim 2, wherein a vacuum chamber area is provided within the coupling between the target electrode tube and the feedthrough, and the coupling is configured to seal the vacuum chamber area from the atmosphere about the vacuum chamber area.

4. A sputter magnetron assembly comprising:
   a support shaft;
   a longitudinally extending target electrode tube having a longitudinal central axis, said tube coupled to said support shaft;
   a magnet within said tube, said magnet bar being held substantially stationary within said target electrode tube; and
   a motor mechanically coupled to said support shaft to allow for both rotation around the axis and linear movement along the axis allowing the target electrode tube to both rotate about and move axially relative to the stationary magnet.

5. The assembly of claim 4 wherein said magnet is a bar magnet held substantially stationary within said tube.

6. The assembly of claim 4 further comprising a mounting plate to which said motor is mounted.

7. The assembly of claim 6 wherein said mounting plate is thrust loaded to induce the linear movement along the axis.

8. The assembly of claim 6 wherein said mounting plate remains stationary.

9. The assembly of claim 4 wherein said shaft has an external spline.

10. The assembly of claim 9 further comprising an internally splined member selectively engaging the external spline of said shaft.

11. The assembly of claim 4 further comprising a bellows maintaining a seal around said shaft.

12. The assembly of claim 4 further comprising a vacuum feedthrough surrounding a portion of said shaft.

13. A method of magnetron sputtering a target material onto a substrate comprising:
    exposing the substrate to a magnetron plasma generated by a rotating target electrode assembly;
    rotating a target electrode tube formed of the target material during the sputtering of the target material onto the substrate;
    linearly moving said target electrode tube relative to said magnetron plasma during the sputtering of the target material onto the substrate; and
    holding a magnet bar being substantially stationary within said rotating and linearly moving target electrode tube.

14. The method of claim 13 wherein said exposing step is in the presence of an inert gas.

15. The method of claim 13 wherein said rotating and said linearly moving are asynchronous.

16. The method of claim 13 further comprising cooling said target electrode assembly during the sputtering of the target material onto the substrate.

17. The method of claim 13 further comprising retaining a bar magnet of said target electrode assembly in a stationary position within said target electrode tube.

18. The sputter magnetron assembly as defined in claim 1 further comprising the target electrode tube coupled with a target tube support shaft that is coaxial with the longitudinal central axis, and extends axially through a rotatably supported feedthrough;
    the target tube support shaft coupled with the feedthrough so that the support shaft can be rotated about the longitudinal axis by a motor;
    a motor mount plate joined to the target tube support shaft through a bearing connection capable of transmitting thrust loads, and axial movement of the target tube support shaft, so that the target electrode tube can be moved axially relative to the stationary magnet.

19. The sputter magnetron assembly as defined in claim 18 further comprising the rotatable feedthrough fixed to a member that has a set of internal splines that engage a set external splines on the target tube support shaft, so that the target tube support shaft and the target electrode tube can be rotated together about the longitudinal central axis; and
    wherein the engagement between the internal splines on the rotatable feedthrough and the external splines on the target tube support shaft enables the target tube support shaft and the target electrode tube to be moved axially relative to the stationary magnet bar.

* * * * *